United States Patent
Takami et al.

(10) Patent No.: US 7,091,496 B2
(45) Date of Patent: Aug. 15, 2006

(54) ELECTRON MICROSCOPIC INSPECTION APPARATUS

(75) Inventors: Sho Takami, Hitachinaka (JP); Tadashi Otaka, Hitachinaka (JP); Manabu Shirakihara, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 489 days.

(21) Appl. No.: 10/462,791

(22) Filed: Jun. 17, 2003

(65) Prior Publication Data

US 2004/0036489 A1 Feb. 26, 2004

(30) Foreign Application Priority Data

Jun. 19, 2002 (JP) .............................. 2002-178802

(51) Int. Cl.
*H01J 37/22* (2006.01)
(52) U.S. Cl. .............................. 250/442.11; 250/440.11
(58) Field of Classification Search ........... 250/442.11, 250/440.11, 310

See application file for complete search history.

(56) References Cited

U.S. PATENT DOCUMENTS 5,092,729 A * 3/1992 Yamazaki et al. ..... 414/225.01

FOREIGN PATENT DOCUMENTS

JP 2000-260776 9/2000

* cited by examiner

*Primary Examiner*—Kiet T. Nguyen
(74) *Attorney, Agent, or Firm*—Dickstein Shapiro Morin & Oshinsky LLP (57) ABSTRACT

Both wafers on which copper wiring was performed and wafers on which non-copper wiring was performed can be inspected by a single unit of electron microscopic inspection apparatus with no possibilities of the wafers being contaminated with copper. All elements within the apparatus that come in contact with wafers, such as hands of a wafer transporter, are duplicated or more and one of the elements that contact wafers is used appropriately for the wafers under inspection which may be either the wafers on which copper wiring was performed or the wafers on which non-copper wiring was performed.

6 Claims, 9 Drawing Sheets

OPERATIONAL SETTING EXAMPLE

1. INSPECTION RECIPE SPECIFIED
2. LOAD PORT SPECIFIED
3. SETTING OF WAFERS TO BE INSPECTED IN CASSETTES OR LOTS
4. (SLOT SPECIFIED)
5. WAFER PROCESS

ELECTRON MICROSCOPIC INSPECTION APPARATUS

BACKGROUND OF THE INVENTION

1. Field of the Invention

The present invention relates to electron microscopic inspection apparatus for semiconductors and, more particularly, to the electron microscopic inspection apparatus for inspecting semiconductor wafers.

2. Description of Related Art

In order to enhance the operating speed of semiconductor devices, semiconductor industries have come to adopt less resistive copper wiring instead of aluminum wiring. However, a problem associated with the copper wiring is that, if copper exists in insulations of semiconductors, it diffuses ten times as fast as aluminum and this deteriorates the device performance. Thus, copper as an impurity should be eliminated completely out of semiconductor fabrication processes. Accordingly, some semiconductor fabrication equipment has been developed to be dedicated to semiconductor production including a copper wiring process (Nikkei Microdevices, February 1999). For example, electroplating apparatus has been contrived to protect the underside surface of a wafer from being contaminated with copper (Nikkei Microdevices, November 1999). Such apparatus is dedicated to semiconductor production including a copper wiring process and contrived to prevent copper impurities from being mixed into semiconductor constituent substances, but a single unit of such apparatus is not designed to process wafers on which non-copper wiring was performed as well as wafers on which copper wiring was performed.

Meanwhile, as disclosed in JP-A No. 260776/2000, there has been proposed an idea to prevent copper diffusion on the wafer side not the wafer fabrication equipment side, but a dedicated process must be added to implement this.

For the purpose of inspecting semiconductor wafers, electron microscopic inspection apparatus such as a metrological scanning electron microscope (SEM) or the like is used. At the present, the electron microscopic inspection apparatus for semiconductor wafers is used such that units of such apparatus provided to inspect wafers on which copper wiring was performed are completely distinct from units of such apparatus provided to inspect wafers on which non-copper wiring was performed. Consequently, if both copper wiring and non-copper wiring processes are included in the entire process of fabricating a specific semiconductor device, the number of required units of electron microscopic inspection apparatus increases by a factor of 1.5 on an average as compared with the process only including the conventional aluminum wiring, though the factor varies, depending on the ratio between both wiring processes.

SUMMARY OF THE INVENTION

It is an object of the present invention to provide electron microscopic inspection apparatus, even a single unit of which capable of inspecting both wafers on which copper wiring was performed and wafers on which non-copper wiring was performed, while preventing the wafers from being contaminated with copper, and without adding a dedicated process.

According to the present invention, both the wafers on which copper wiring was performed and the wafers on which non-copper wiring was performed can be inspected by a single unit of inspection apparatus with no possibilities of the wafers being contaminated with copper.

Because there is no copper atmosphere in a wafer passage within the electron microscopic inspection apparatus, copper diffusion in the apparatus can be prevented if it is avoided that copper is diffused through the medium of something that comes in direct contact with copper. In other words, by eliminating any possibility of the wafers on which copper wiring was performed coming in direct or indirect contact with the wafers on which non-copper wiring was performed, a single unit of such apparatus is made able to inspect the wafers, whether copper or non-copper wiring was performed on them.

Through such consideration, the present invention has been made and one aspect of the invention resides in an electron microscopic inspection apparatus comprising means for transporting wafers between wafer container means and a main body of the apparatus, aligner means for aligning wafer orientation, and wafer mount means for supporting and moving wafers within the main body of the apparatus, wherein the wafer transporting means, the aligner means, and the wafer mount means have a plurality of wafer support elements, respectively, and one of the plurality of wafer support elements contacts and supports wafers under inspection.

The aligner means detects the orientation flat and notch for each wafer and align the wafer orientation. One wafer support elements may support a wafer with one contact member or a plurality of contact members with the wafer.

One of the plurality of wafer support elements is used appropriately for a wafer process performed on the wafers under inspection. For example, one of the plurality of wafer support elements is appointed to support a wafer on which copper wiring was performed and the other of the plurality of wafer support elements is appointed to support a wafer on which non-copper wiring was performed. Alternatively, one of the plurality of wafer support elements is appointed to support a silicon semiconductor wafer and the other of the plurality of wafer support elements is appointed to support a hybrid semiconductor wafer.

The electron microscopic inspection apparatus of the present invention further comprises means for discriminating between types of the wafer container means and a control unit for controlling the water transporting means, aligner means, and wafer mount means, wherein the control unit determines one of the plurality of wafer support elements to be used for the wafers under inspection in the wafer transporting means, aligner means, and wafer mount means, according to a signal from the discriminating means.

According to another aspect of the invention, the electron microscopic inspection apparatus further comprises the control unit for controlling the wafer transporting means, aligner means, and wafer mount means, wherein the control unit determines one of the plurality of wafer support elements to be used for the wafers under inspection in the wafer transporting means, aligner means, and wafer mount means, according to wafer process information sent from an external computer.

According to the present invention, semiconductor production can be sustained by a minimum necessary number of units of the electron microscopic inspection apparatus, and, consequently, semiconductor manufacturers can reduce investment in factory equipments and the space required for the equipments. This especially gives study and development sections much of an advantage.

DETAILED DESCRIPTION OF THE PREFERRED EMBODIMENTS

Preferred embodiments of the present invention now are described hereinafter with reference to the accompanying drawings. In the drawings to be referred to hereinafter, like reference numbers refer to parts having like functions and repeated explanation is avoided.

Figure 1:
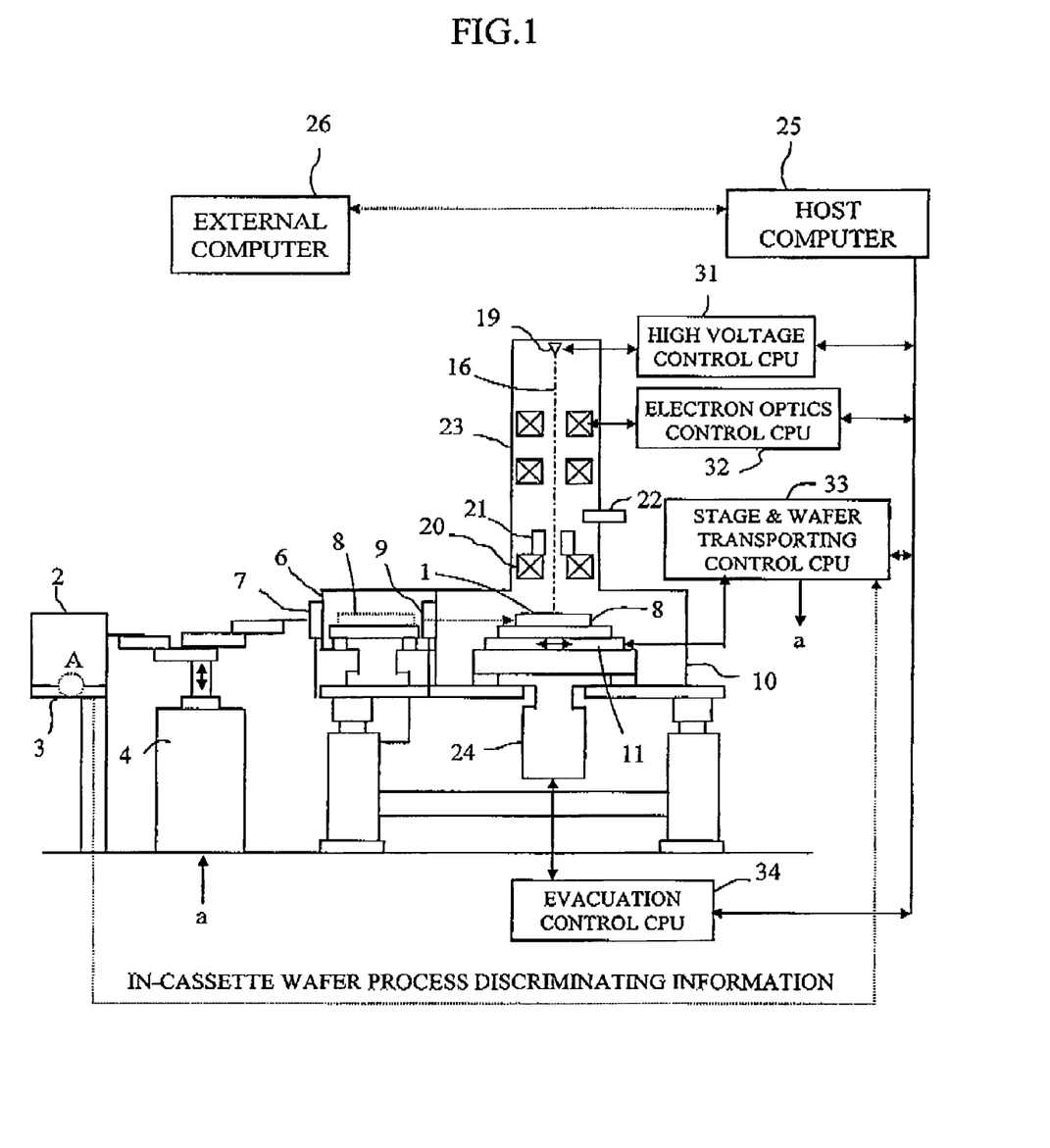
FIG. 1 is a schematic diagram showing an example of the electron microscopic inspection apparatus in accordance with the present invention.

FIG. 1 is a schematic diagram showing an example of the electron microscopic inspection apparatus in accordance with the present invention.

Electrons emitted from an electron source 19 are converged through electron optics 20 and, with the electrons controlled by a deflector 21, a wafer 1 supported on a wafer holder 8 is scanned. A detector 22 detects secondary electrons and reflected electrons from the water 1 and a secondary electron image, a reflected electron image, and a potential contrast image are generated. Electron optics columns 23, a load lock chamber 6, and a scanning chamber 10 can remain in a vacuum through evacuation by a vacuum pump 24 and can be opened to atmospheric pressure by purging dry nitrogen gas when necessary.

Usually, wafers under inspection 1 are put in a Front Opening Unified Pod (FOUP) or a cassette 2 which is mounted on a load port 3. A wafer transporter 4 withdraws an arbitrary wafer under inspection 1 from the cassette 2 and puts the wafer under inspection on an aligner table which is not shown in FIG. 1. When the load lock chamber 6 is opened to atmosphere and a valve 7 becomes open, the wafer transporter 4 sets the wafer aligned by the aligner on the wafer holder 8 within the load lock chamber 6. When the valve 7 is closed and the load lock chamber 6 is evacuated to a vacuum, a valve 9 opens and the wafer 1 mounted on the wafer holder 8 is loaded onto a stage 11 within the scanning chamber 10. The stage 11 can move the wafer 1 at least in two dimensions so that an arbitrary position on the wafer comes directly under an optical beam axis of electrons 16. Thereby, with regard to a desired probe point on the wafer, measurement of pattern dimensions, pattern appearance check, foreign substance detection, foreign substance observation, and other inspection can be performed.

The wafer under inspection 1 for which inspection has finished, remaining mounted on the wafer holder 8, is unloaded to the load lock chamber 6 in the reverse direction. When the load lock chamber 6 is opened to atmosphere, the wafer transporter 4 picks up the wafer 1 from the wafer holder 8 and unloads the wafer to the cassette 2. By repeating the procedure described above, the inspection of a plurality of wafers put in the cassette 2 is performed automatically.

The electron source 19 of the electron microscopic inspection apparatus is controlled by a high voltage control CPU 31 and the electron optics 20 are controlled by a electron optics control CPU 32. The vacuum pump 24 is controlled by an evacuation control CPU 34. The waver transporter 4 and stage 11 drives are controlled by a stage and wafer transporting control CPU 33. These control CPUs 31 to 34 are managed by a host computer 25 of the electron microscopic inspection apparatus. The host computer 25 also performs the management of recipes which define a sequence of the above inspection operation. The host computer 25 connects to and communicates with an external computer 26 such as a host computer for a production line and receives recipe specifications appropriate for the wafers under inspection from the external computer and sends measurement results to the external computer.

Figure 2:
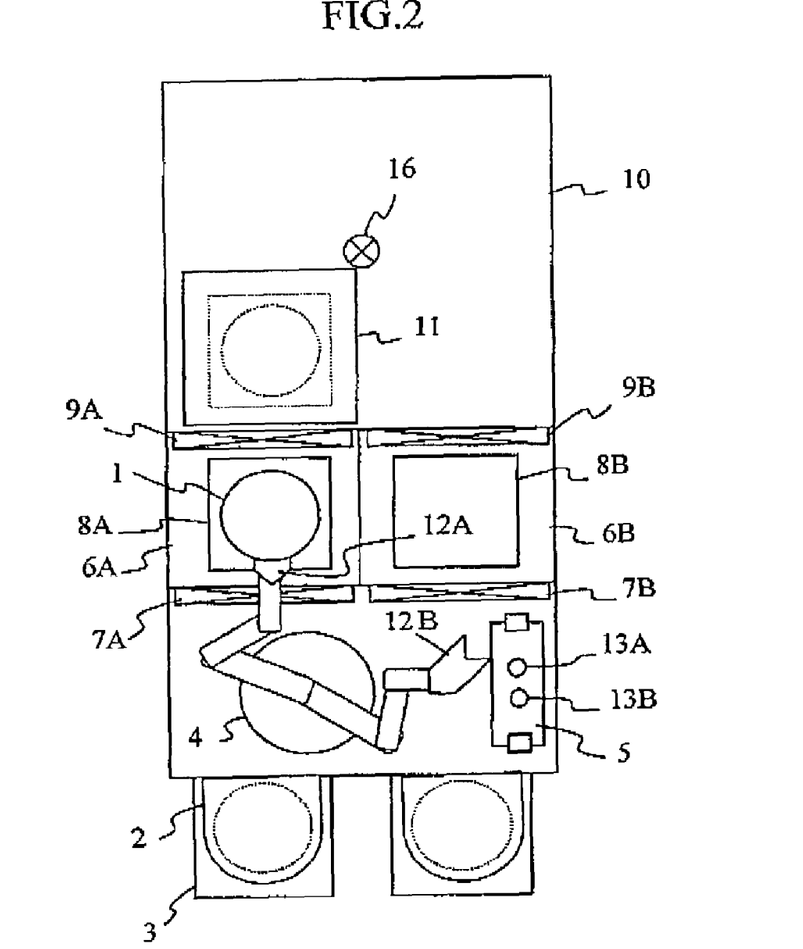
FIG. 2 is a schematic plan view of the electron microscopic inspection apparatus for explaining the wafer passage.

FIG. 2 is a schematic plan view of the electron microscopic inspection apparatus shown in FIG. 1 for explaining the wafer passage.

Among the components of the electron microscopic inspection apparatus, the wafer transporter 4, aligner 5, and wafer holder 8 have elements that come in contact with wafers. The cassette 2 also has elements that come in contact with wafers, but the cassette 2 should be managed by a user and is not considered as a component of the electron microscopic inspection apparatus. The electron microscopic inspection apparatus of the present embodiment includes at least two wafer supporting elements in contact with wafers in the wafer transporter 4, aligner 5, and wafer holder 8, respectively.

The elements of the wafer transporter 4 which come into contact with wafers are hands 12 which come in contact with the underside surface of a wafer. As shown in FIG. 1 and FIG. 2, the wafer transporter 4 has two arms 12A and 12B. For example, one arm 12A is appointed as the arm to transport wafers on which copper wiring was performed and the other arm 123 is appointed as the arm to transport wafers on which non-copper wiring was performed. By using one of the two arms 12A and 12B appropriately for a wafer process performed on the wafers under inspection, it is avoided that wafers on which non-copper wiring was performed are contaminated with copper from wafers on which copper wiring was performed through the medium of the wafer transporter 4.

Next, the aligner 5 is discussed. The aligner 5 is to detect the orientation flat and V notch for each wafer and align the wafer orientation by rotating the wafer. The elements of the aligner 5 which come into contact with wafers are tables on which wafers are mounted for notch or orientation flat detection. In the present embodiment, the aligner 5 has two tables 13A and 13B. For example, one table 13A is appointed as the table on which wafers on which copper wiring was performed are to be mounted and the other table 13B is appointed as the table on which wafers on which non-copper wiring was performed are to be mounted. By using one of the two tables 13A and 13B appropriately for the type of the wafers under inspection, it can be avoided that wafers on which non-copper wiring was performed are contaminated with copper from wafers on which copper wiring was performed through the medium of the aligner 5.

Figure 3:
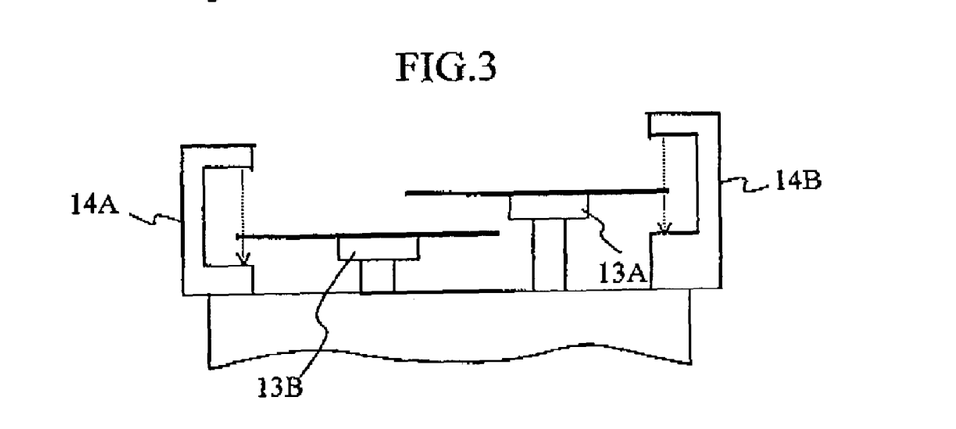
FIG. 3 is a side view of an aligner.

FIG. 3 is a side view of the aligner 5. In the aligner shown in FIG. 2, the two tables 13A and 13B are horizontally installed in different position. In this case, by installing the tables 13A and 13B at different height, as shown in the side view of FIG. 3, the required area for the aligner 5 can be reduced. As notch detectors 14A and 14B of the aligner 4, transmission-type light sensors and laser sensors can be used.

Next, the wafer holder is discussed. The wafer holder is used to transport a wafer 1 between the load lock chamber 6 and the scanning chamber 10 and the holder on which the wafer is mounted is set on the stage 11 so that the wafer 1 is moved inside the scanning chamber 10. The electron microscopic inspection apparatus of the present embodiment includes two independent load lock chambers 6A and 6B. The load lock chambers 6A and 6B are equipped with valves 7A and 7B, respectively, to open the load lock chambers 6A and 6B to atmosphere and close the chambers and valves 9A and 9B, respectively, to open and close the passage to the scanning chamber 10. Wafer holders 8A and 8B are provided in the load lock chambers 6A and 6B, respectively. For instance, one load lock chamber 6A and one wafer holder 8A provided therein are appointed to be used for wafers on which copper wiring was performed and the other load lock chamber 6B and the other wafer holder 8B provided therein are appointed to be used for wafers on which non-copper wiring was performed. By using on of the two wafer holders 8A and 8B appropriately for the type of the wafers under inspection, it can be avoided that wafers on which non-copper wiring was performed are contaminated with copper from wafers on which copper wiring was performed through the medium of the wafer holders.

Figure 4:
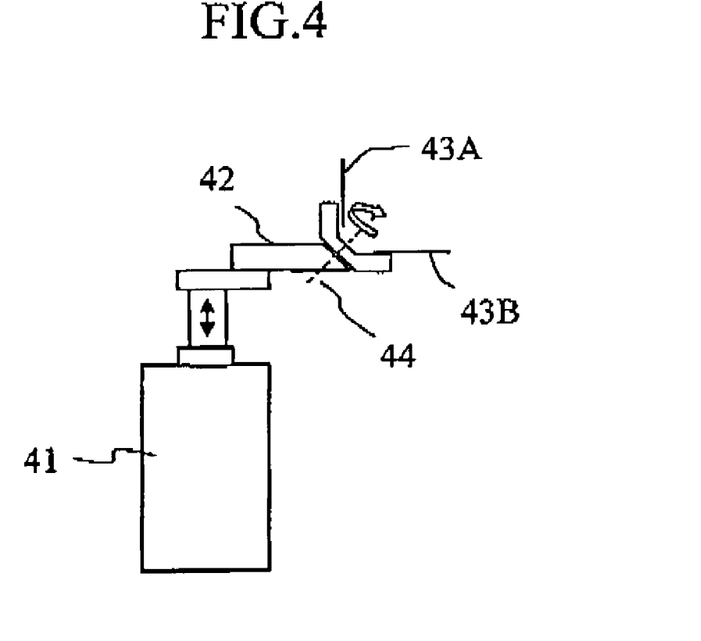
FIG. 4 is a schematic diagram showing another example of a wafer transporter.

FIG. 4 is a schematic diagram showing another wafer transporter example with at least two elements that come in contact with wafers. This water transporter 41 has a single articulated arm 42 with two hands 43A and 43B or more on its end. The end of the articulated arm 42 is rotated on the axis 44 such that the hand to be used can be selected. The hand 43B is ready for use in the state shown. In the wafer transporter 41 having the above-described structure as well, for example, one hand 43A is appointed to transport wafers on which copper wiring was performed and the other hand 43B is appointed to transport wafers on which non-copper wiring was performed. By using one of the two hands 43A and 43B appropriately for the type of the wafers under inspection, it can be avoided that wafers on which non-copper wiring was performed are contaminated with copper from wafers on which copper wiring was performed through the medium of the wafer transporter.

Figure 5:
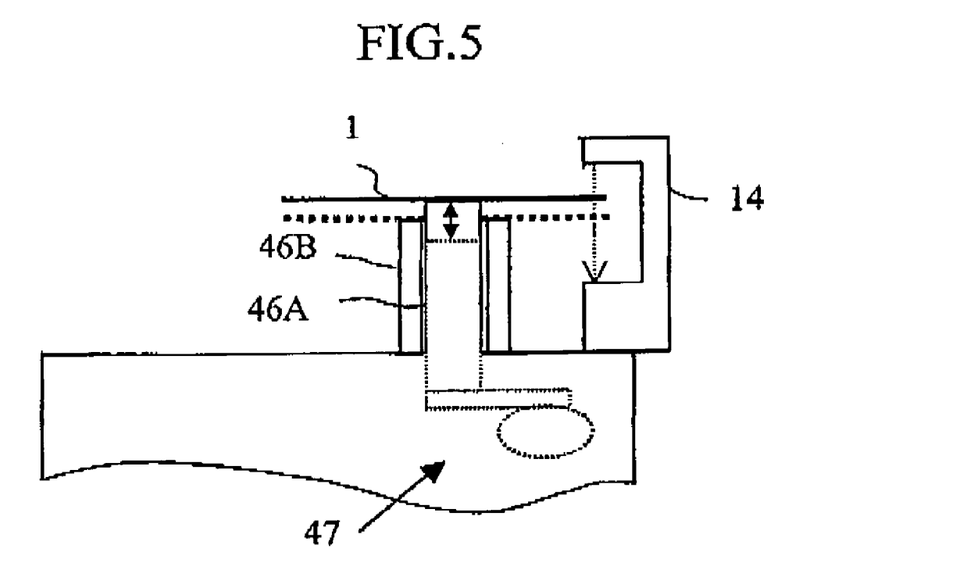
FIG. 5 is a sectional side view of another aligner example having two tables.

FIG. 5 is a sectional side view of another aligner example having two tables. The aligner of this example has two tables 46A and 46B which are concentric and only the inner one of which moves vertically. The inner table 46A concentric with the outer table can move vertically higher or lower than the outer table 46B by a cam follower mechanism 47 or the like.

When the inner table 46A is set higher than the outer table as indicated by a solid line in FIG. 5, a wafer 1 rotates, supported on the inner table 46A. When the inner table 46A is set lower than the outer table, a wafer rotates, supported on the outer table 46B. A mechanism which rotates the tables is not shown. In the case of use of the aligner having the above-described structure as well, for instance, the inner table 46A is appointed as the table on which wafers on which copper wiring was performed are to be mounted and the outer table 46B is appointed as the table on which wafers on which non-copper wiring was performed are to be mounted. By using one of the two tables 46A and 46B appropriately for the type of the wafers under inspection, it can be avoided that wafers on which non-copper wiring was performed are contaminated with copper from wafers on which copper wiring was performed through the medium of the aligner.

Figure 6:
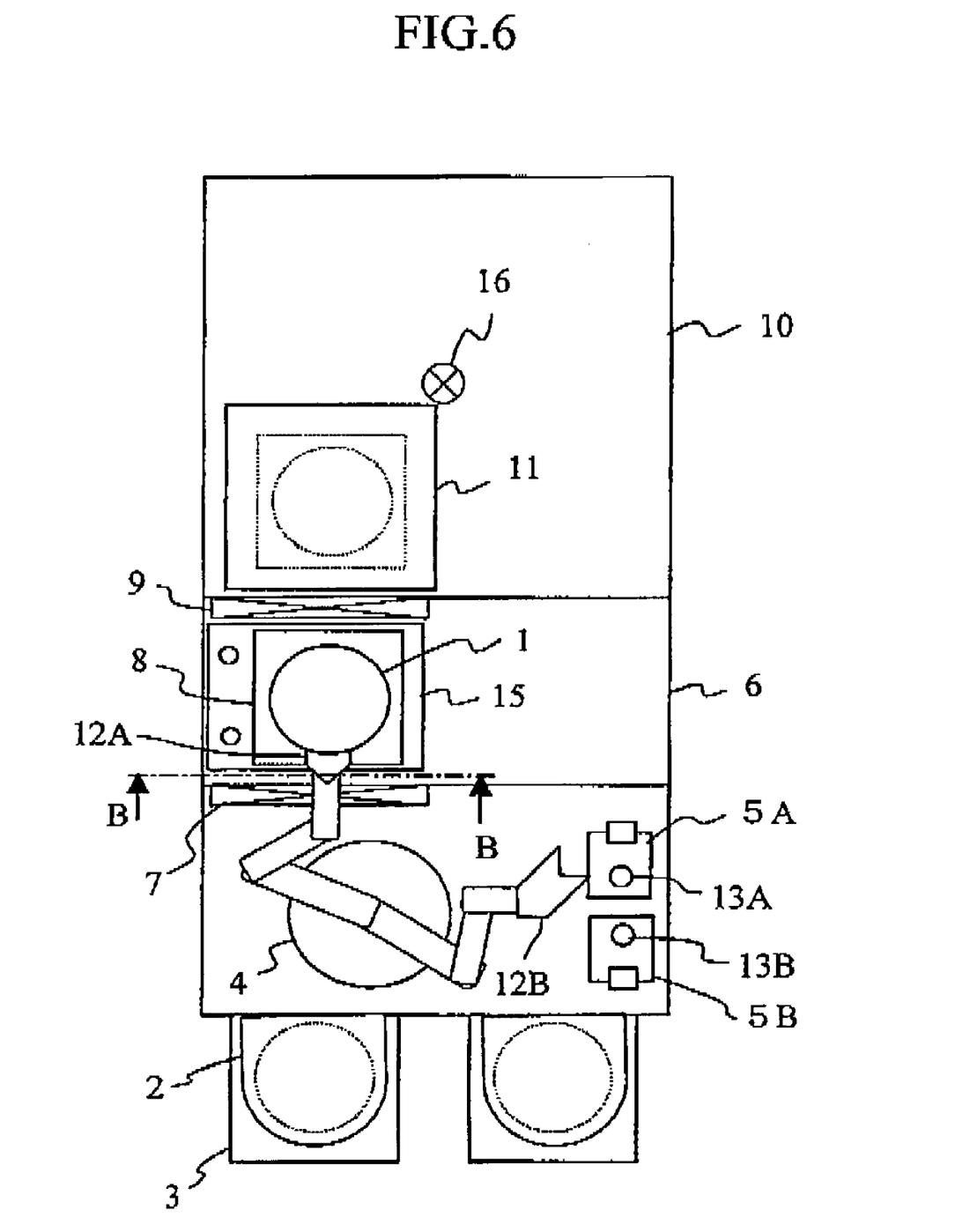
FIG. 6 is a schematic plan view of another example the electron microscopic inspection apparatus in accordance with the present invention for explaining different wafer passage.

FIG. 6 is a schematic plan view of another example of the electron microscopic inspection apparatus in accordance with the present invention for explaining different wafer passage and this plan view corresponds to FIG. 2. This embodiment is an example where the apparatus includes only a single load lock chamber 6. In the load lock chamber 6, a wafer holder change mechanism 15 having an elevator mechanism or the like is provided and two wafer holders 8 can be housed in the chamber. In this embodiment, independent aligners 5A and 5B are provided separately.

Figure 7A:
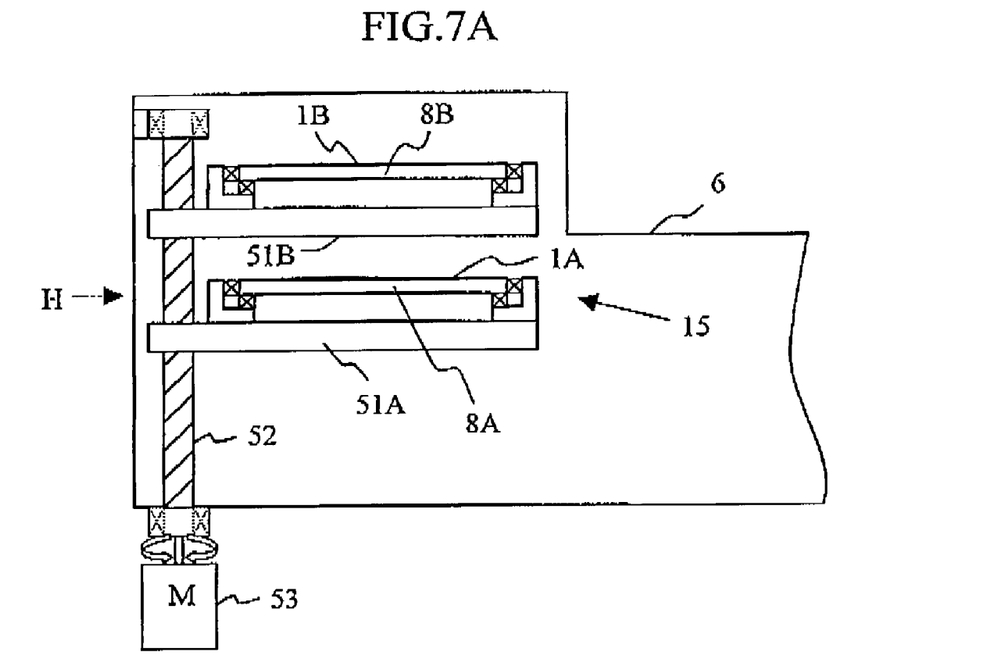
FIG. 7A is a B—B section view of a load lock chamber viewed in the direction of arrow B of FIG. 6.
Figure 7B:
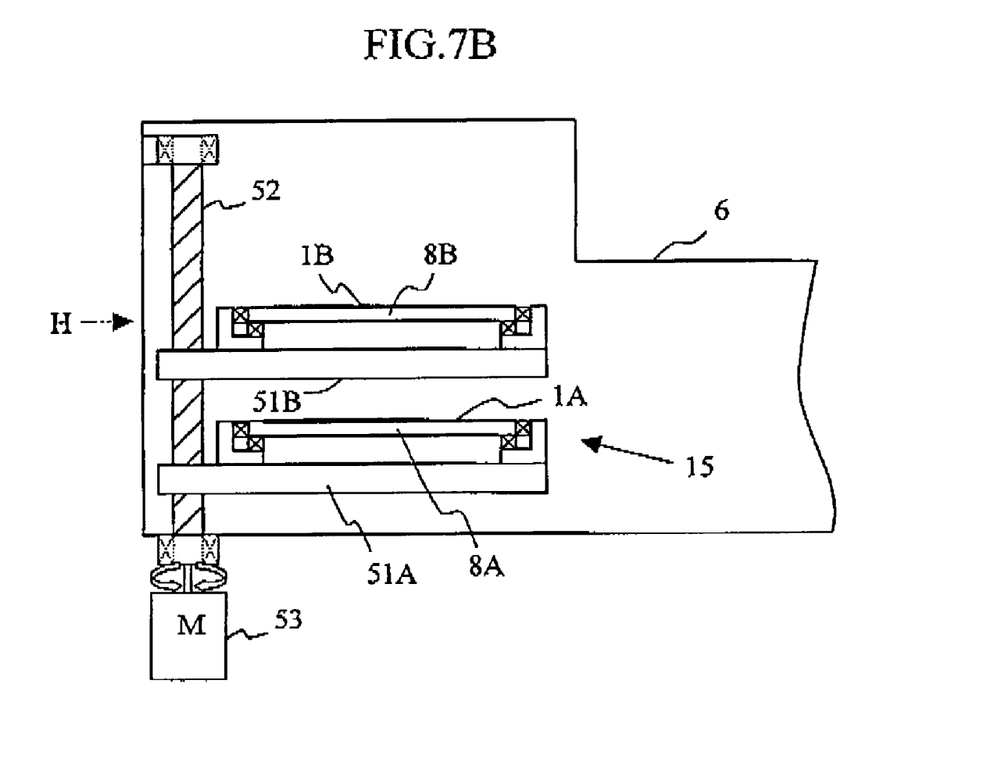
FIG. 7B is another B—B section view of the load lock chamber viewed in the direction of arrow B of FIG. 6.

FIG. 7 shows B-B section views of the load lock chamber 6 viewed in the direction of arrow B of FIG. 6. In the load lock chamber 6, the wafer holder change mechanism 15 is installed which comprises two wafer holder mounts 51A and 51B, a ball screw 52 which causes the wafer holder mounts 51A and 51B to move vertically, and a motor 53 which rotates and drives the ball screw 52. The wafer holders 8A and 8B, on the top surfaces of which wafers 1A and 1B can be mounted, respectively, can be mounted on the wafer holder mounts 51A and 51B, respectively. Height position H marked in the figures indicates the height at which the wafer holder is loaded and unloaded.

As shown in FIG. 7A, when, through the elevator mechanism, the lower wafer holder mount 51A is positioned at the height H allowing the wafer holder to be loaded and unloaded, the wafer holder 8A mounted on the lower wafer holder mount 51A can be selected and changed. As shown in FIG. 7B, when, through the elevator mechanism, the upper wafer holder mount 51B is positioned at the height H allowing the wafer holder to be loaded and unloaded, the wafer holder 8B mounted on the upper wafer holder mount 51B can be selected and changed. Even with a single load lock chamber 6, the wafer holder change mechanism 15 can select in this manner a desired wafer holder suitable for the wafer process performed on the wafer to be loaded and load the wafer holder to the scanning chamber 10.

Figure 8:
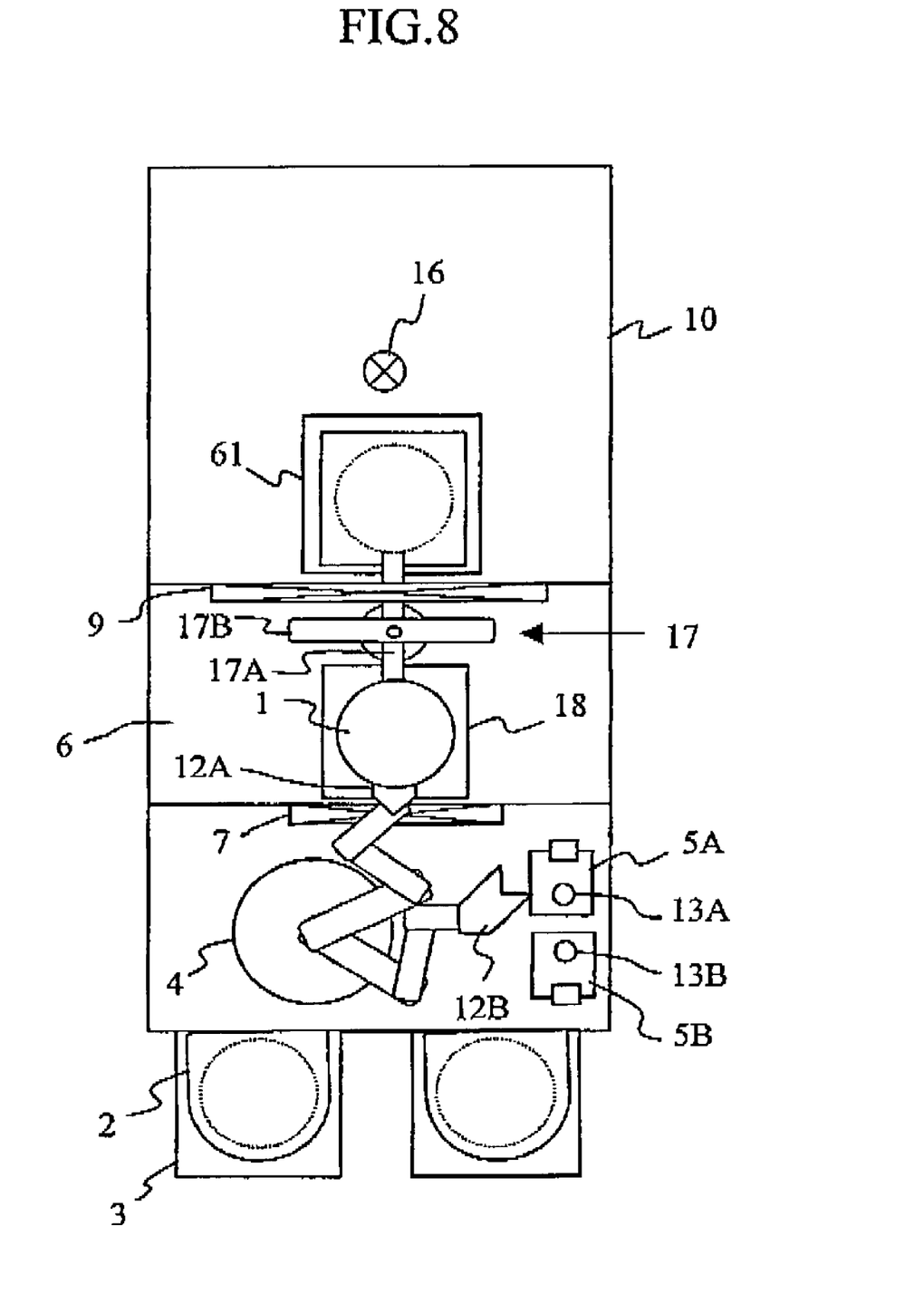
FIG. 8 is a schematic plan view of a further example of the electron microscopic inspection apparatus in accordance with the present invention for explaining yet different wafer passage

FIG. 8 is a schematic plan view of a further example of the electron microscopic inspection apparatus in accordance with the present invention for explaining yet different wafer passage and this plan view corresponds to FIG. 2. This embodiment is also an example where the apparatus includes only a single load lock chamber 6.

The wafer 1 set on a wafer mount 18 is set on a stage 61, using a wafer change mechanism 17 which can be used in a vacuum. In this embodiment, the stage 61, wafer change mechanism 17, and wafer mount 18 have two or more elements that come in contact with wafers, respectively. A plurality of stages of wafer mounts 18 are vertically disposed and can be moved up and down by an elevator mechanism shown in FIGS. 7A and 7B. Thus, two or more mounts which come in contact with wafers can be provided even if they are in one area in plan as shown in FIG. 8. The wafer change mechanism 17 has two arms 17A and 17B and the arms 17A and 17B can support wafers on both ends, respectively.

Figure 9A:
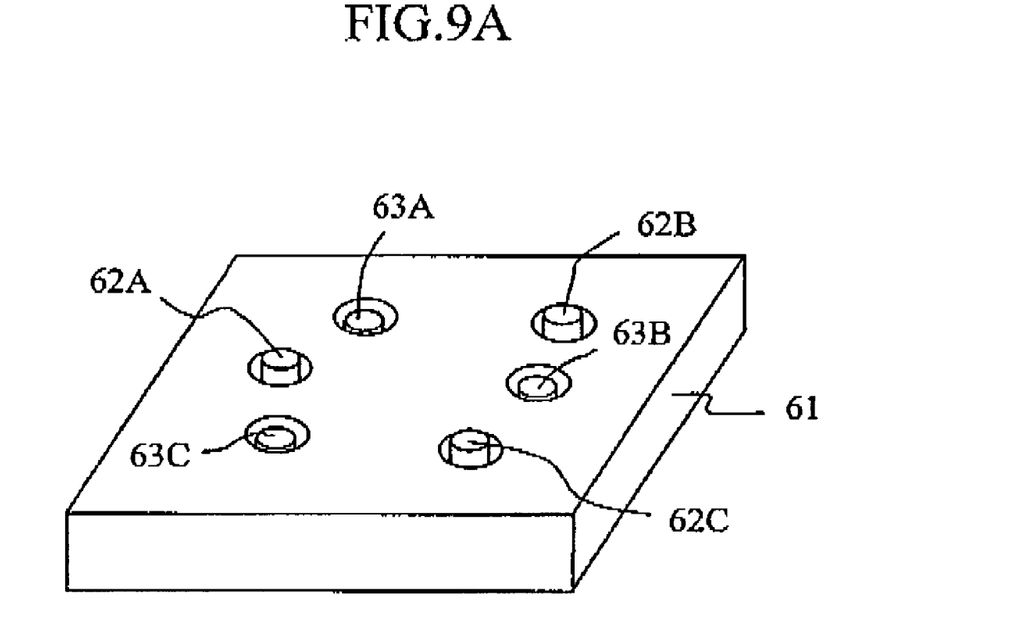
FIG. 9A shows an example of pads which come in contact with a wafer on the top surface of a stage.
Figure 9B:
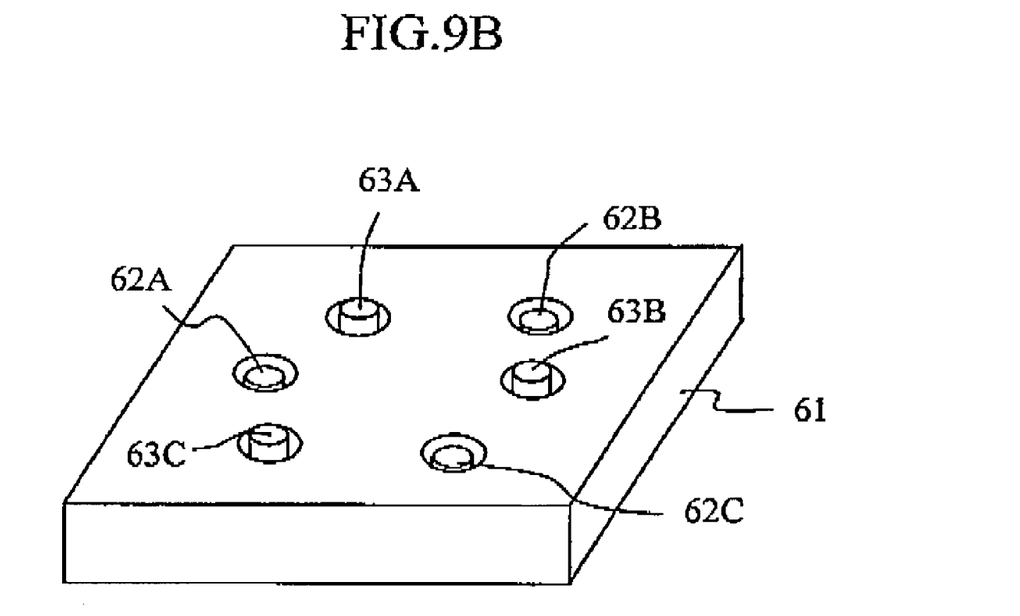
FIG. 9B shows another example of pads which come in contact with a wafer on the top surface of a stage.

FIG. 9 shows an example of the stage 61 used in this embodiment. The stage 61 of this example is provided with two or more sets of three pads 62A to 62C and 63A to 63C which support a wafer, respectively, and can move up and down. This structure allows one set of the pads to support a wafer under inspection for which a specific wafer process was performed while the other set of the pads being retracted not to contact with the wafer. In this way, two or more wafer supports can be provided.

FIG. 9A shows one state where the pads 62A to 62C are protruded while the pads 63A to 63C are retracted so that a wafer is supported by the protruded pads 62A to 62C. FIG. 9B shows another state where the pads 63A to 63C are protruded while the pads 62A to 62C are retracted so that a wafer is supported by the protruded pads 63A to 63C. For example, the pads 62A to 62C are appointed as the pads to support a wafer on which copper wiring was performed and the pads 63A to 63C are appointed as the pads to support a wafer on which non-copper wiring was performed. By using one of the two sets of the pads 62A to 62C and 63A to 63C appropriately for the type of the wafers under inspection, it can be avoided that wafers on which non-copper wiring was performed are contaminated with copper from wafers on which copper wiring was performed through the medium of the stage 61.

FIG. 10 illustrates in detail wafer change action using the above-mentioned wafer change mechanism 17. Through the example where the upper and lower two stages of wafer mounts 18A and 18B which can be moved up and down by the elevator mechanism are employed as the wafer mounts 18, as shown in FIG. 7, the wafer change action will be explained. For example, when changing wafers on which copper wiring was performed, the lower wafer mount 18A of the upper and lower two stages of wafer mounts and the arm 17A of the wafer change mechanism 17 are used as shown in FIGS. 10A and 10B. When changing wafers on which non-copper wiring was performed, the upper wafer mount 18B of the upper and lower two stages of wafer mounts and the arm 17B of the wafer change mechanism 17 are used as shown in FIGS. 10C and 10D.

Figure 10A:
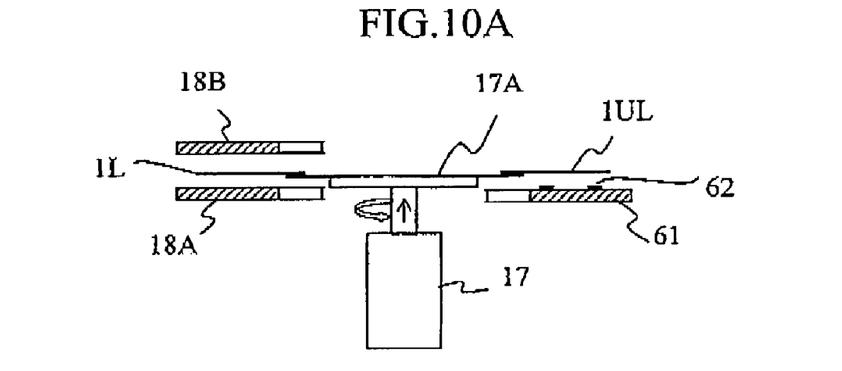
FIG. 10A, FIG. 10B, FIG. 10C, and FIG. 10D illustrate wafer change action.
Figure 10B:
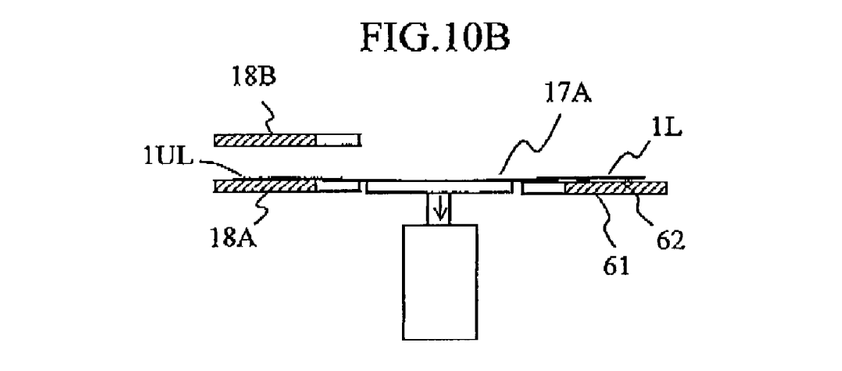
Figure 10C:
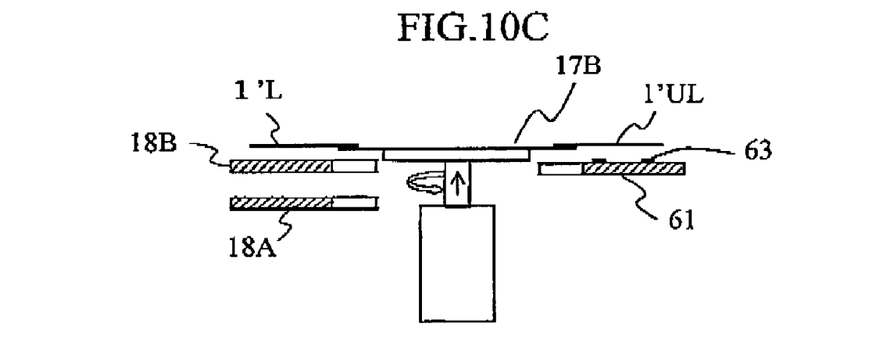
Figure 10D:
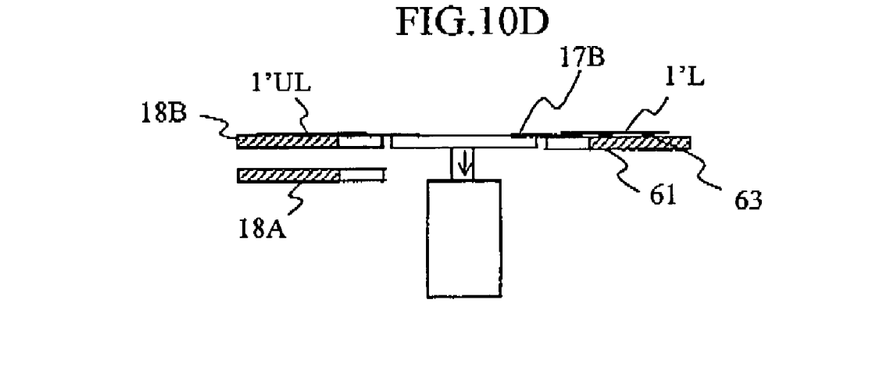

FIG. 10A shows a state where the arm 17A of the wafer change mechanism 17 supports on both ends, for example, an inspected wafer 1UL on which copper wiring was performed, which was being supported on the protruded pads 62 on the stage 61, and a wafer 1L, the next one to inspect, on which copper wiring was performed and which was being mounted on the lower wafer mount 18A of the upper and lower two stages of mounts. From this state, as the arm 17A rotates, the inspected wafer 1UL on which copper wiring was performed is set on the wafer mount 18A and the next wafer 1L to inspect on which copper wiring was performed is set on the protruded pads 62 on the stage 61, as shown in FIG. 10B. Meanwhile, FIG. 10C shows a state where the arm 17B of the wafer change mechanism 17 supports on both ends an inspected wafer 1'UL on which non-copper wiring was performed, which was being supported on the protruded pads 63 on the stage 61, and a wafer 1'L, the next one to inspect, on which non-copper wiring was performed and which was being mounted on the upper wafer mount 18B of the upper and lower two stages of mounts. From this state, as the arm 17B rotates, the inspected wafer 1'UL on which non-copper wiring was performed is set on the wafer mount 18B and the next wafer 1'L to inspect on which non-copper wiring was performed is set on the protruded pads 63 on the stage 61, as shown in FIG. 10D.

In this manner, according to whether the wafers to handle are those on which copper wiring was performed or those on which non-copper wiring was performed, by using one of the wafer mounts 18A and 18B, one of the arms 17A and 17B of the wafer change mechanism 17, and one of the sets of the pads 63 and 64 appropriately, it can be avoided that wafers on which non-copper wiring was performed are contaminated with copper from wafers on which copper wiring was performed.

Next, a method of judging whether the wafer 1 under inspection is the wafer on which copper wiring was performed or the wafer on which non-copper wiring was performed and setting the electron microscopic inspection apparatus to operate, according to this judgment, is discussed. Discrimination between wafer types may be performed by an operator, that is, the operator judges which process was performed on the wafers under inspection and enters this information to the apparatus. However, in order to eliminate the possibility of human errors, it is desirable to arrange for a mechanism that allows the apparatus to automatically discriminate between wafer types and use one of the plurality of the parts that come in contact with wafers appropriately, based on the self-obtained information for wafer type discrimination.

Discrimination between wafer processes can be made, for example, at the load port 3, by judging whether the cassette 2 contains wafers on which copper wiring was performed or wafers on which non-copper wiring was performed. In common practice, users discriminate between a cassette 2 of waters on which copper wiring was performed and a cassette 2 of wafers on which non-copper wiring was performed. Through detection of the type of the cassette present at the load port 3, the apparatus can automatically judge whether the cassette contains wafers on which copper wiring was performed or wafers on which non-copper wiring was performed and use one of the plurality of the parts that come in contact with wafers appropriately.

Figure 11A:
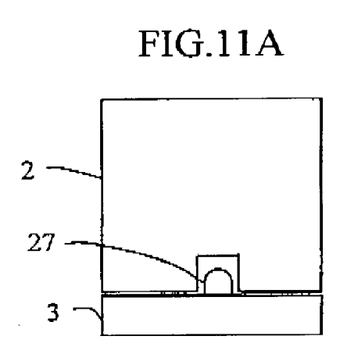
FIG. 11A, FIG. 11B, and FIG. 11C are detail views of section A of FIG. 1.
Figure 11B:
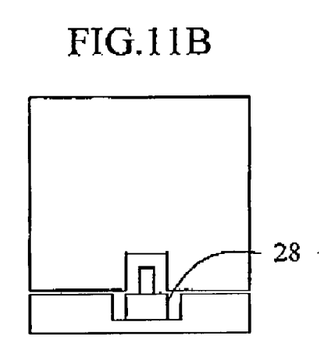
Figure 11C:
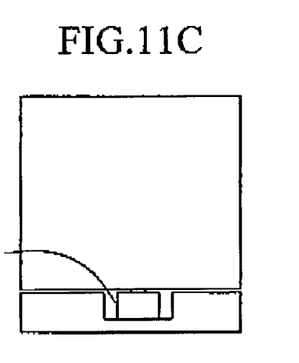

As is illustrated in FIG. 11 that shows details on section A of FIG. 1, for example, an incorrect mounting prevention pin 27 is currently employed in the load port. According to whether this pin fits in the recess of a-cassette 2, cassettes or FOUPs of wafers on which copper wiring was performed can be discriminated from those of wafers on which non-copper wiring was performed is made, thus preventing mixing of the different types of cassettes in the load port. Instead of the incorrect mounting prevention pin 27, a micro switch or the like can be used to detect the cassette type by the activation of the micro switch 28, if the switch is set to be activated for the cassettes of wafers for which a specific process was performed. The thus detected signal as in-cassette wafer discriminating information is sent to the stage and wafer transporting control CPU 33, as indicated in FIG. 1. According to this discriminating information, the stage and wafer transporting control CPU 33 can control the stage and transporter elements that come in contact with wafers so that one of the plurality of parts should be used appropriately for the wafers under inspection which may be either the wafers on which copper wiring was performed or the wafers on which non-copper wiring was performed.

Similarly, information as to discrimination between cassettes of wafers or wafers on which copper wiring was performed and cassettes of wafers or wafers on which non-copper wiring was performed may be transferred online from the external computer 26 such as the computer supervising semiconductor production lines to the host computer 25 of the electron microscopic inspection apparatus. Based on such information, the electron microscopic inspection apparatus can use one of the plurality of parts that come in contact with wafers appropriately for the wafers under inspection which may be either the wafers on which copper wiring was performed or the wafers on which non-copper wiring was performed.

Figure 12:
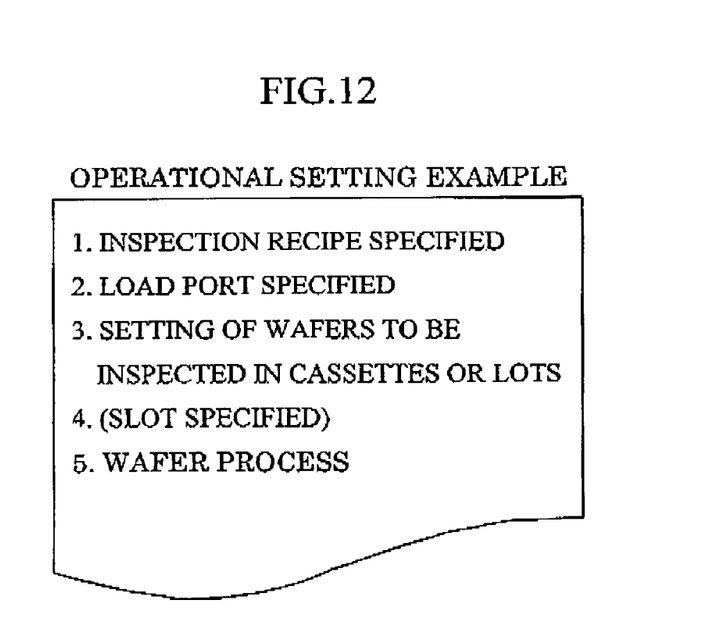
FIG. 12 illustrates an operational setting example to be supplied to the electron microscopic inspection apparatus.

FIG. 12 illustrates an operational setting example to be supplied to the electron microscopic inspection apparatus. With the automation of wafer production lines, online apparatus operational setting to handle discrete lots and wafer types has already been practiced. By including information for copper wiring discrimination from other types of wiring performed on wafers in the currently supplied information to the apparatus, the above control can easily be performed. The external computer mentioned herein may be provided to execute either apparatus management or production line management.

Embodiment examples in which one of the plurality of parts that come in contact with wafers is used appropriately for the wafers under inspection which may be either the wafers on which copper wiring was performed or the wafers on which non-copper wiring performed have been described hereinbefore. However, the present invention is also applicable to other cases, for instance, when handling a plurality of types of wafers which may be either silicon semiconductors or hybrid semiconductors, in addition to the kinds of wafers discussed in the embodiments. For example, semiconductors include arsenic which is harmful to the human body and their handling needs care. Thus, the parts of the inspection apparatus which come in contact with the gallium-arsenic semiconductor wafers should be separate from the parts that come in contact with silicon semiconductor wafers for easy handling management. The invented inspection apparatus can prevent the diffusion of compounds and atoms of silicon semiconductors and hybrid semiconductors into other type ones as can prevent copper diffusion into wafers on which non-copper wiring was performed.

What is claimed is:

1. An electron microscopic inspection apparatus comprising means for transporting wafers between wafer container means and a main body of the apparatus, aligner means for aligning wafer orientation, and wafer mount means for supporting and moving wafers within the main body of the apparatus, wherein each of the wafer transporting means, the aligner means, and the wafer mount means has a plurality of wafer support elements, and one of the plurality of wafer support elements of the wafer mount means contacts and supports wafers under inspection.

2. The electron microscopic inspection apparatus according to claim 1, wherein one of the plurality of wafer support elements is used appropriately for a wafer process performed on the wafers under inspection.

3. The electron microscopic inspection apparatus according to claim 1, wherein one of the plurality of wafer support elements is appointed to support a wafer on which copper wiring was performed and the other of the plurality of wafer support elements is appointed to support a wafer on which non-copper wiring was performed.

4. The electron microscopic inspection apparatus according to claim 1, wherein one of the plurality of wafer support elements is appointed to support a silicon semiconductor wafer and the other of the plurality of wafer support elements is appointed to support a hybrid semiconductor wafer.

5. The electron microscopic inspection apparatus according to claim 1, further comprising means for discriminating between types of said wafers in container means and a control unit for controlling said wafer transporting means, said aligner means, and said wafer mount means, wherein said control unit determines one of the plurality of wafer support elements to be used for the wafers under inspection in said wafer transporting means, said aligner means, and said wafer mount means, according to a signal from said discriminating means.

6. The electron microscopic inspection apparatus according to claim 1, further comprising a control unit for controlling said wafer transporting means, said aligner means, and said wafer mount means, wherein said control unit determines one of the plurality of wafer support elements to be used for the wafers under inspection in said wafer transporting means, said aligner means, and said wafer mount means, according to water process information sent from an external computer.

* * * * *